United States Patent [19]

Hayashi et al.

[11] Patent Number: 4,916,323
[45] Date of Patent: Apr. 10, 1990

[54] OPTICAL CONTROL CIRCUIT AND A SEMICONDUCTOR DEVICE FOR REALIZING SAME

[75] Inventors: Yutaka Hayashi, Ibaragi; Shigeaki Tomonari, Kadoma; Keizi Kakite, Kadoma; Jun Sakai, Kadoma, all of Japan

[73] Assignees: Agency of Industrial Science and Technology, Ibaragi; Matsushita Electric Works, Ltd., Osaka, both of Japan

[21] Appl. No.: 247,081

[22] Filed: Sep. 21, 1988

[30] Foreign Application Priority Data

Sep. 24, 1987 [JP] Japan .................... 62-239169

[51] Int. Cl.⁴ .................................. G02B 27/00
[52] U.S. Cl. .......................... 250/551; 307/311
[58] Field of Search .............. 250/551; 307/311; 357/19

[56] References Cited

U.S. PATENT DOCUMENTS 4,307,298 12/1981 El Hamamsy ............ 307/311
4,500,801 2/1985 Janutka ....................... 307/570
4,801,822 1/1989 Idaka ......................... 307/311

Primary Examiner—David C. Nelms
Assistant Examiner—Sherrie Hsia
Attorney, Agent, or Firm—Burns, Doane, Swecker & Mathis

[57] ABSTRACT

An optical control circuit is formed by a first transistor, a first resistive element connected between control electrode and first output electrode of the first transistor. The first output electrode forms an emitter or source of the transistor, a second resistive element is connected between the control electrode and second output electrode of the first transistor. The second output electrode forms a collector or drain of the transistor and an array of photovoltaic elements is connected in parallel to the second resistive element. A second transistor has a control electrode connected to the second output electrode of the first transistor. High speed operation of the second transistor can be assured, any noise voltage applied to the control electrode of the second transistor can be effectively bypassed, and the first transistor can be simultaneously formed in a substrate of the second transistor to be integralized therewith.

45 Claims, 8 Drawing Sheets

OPTICAL CONTROL CIRCUIT AND A SEMICONDUCTOR DEVICE FOR REALIZING SAME

BACKGROUND ART OF INVENTION

This invention relates to a circuit for optically controlling input and output currents or output voltage of the circuit and to a semiconductor device for realizing the same.

The optical control circuit of the kind referred to generally comprises a second transistor having a control electrode and a pair of output electrodes forming respectively a collector or drain and an emitter or source and receiving a photo-voltage generated by an array of photovoltaic elements, at the control electrode of the second transistor being controlled so that the input and output currents or output voltage at the output electrodes can be effectively controlled, and eventually a quick operation of the second transistor can be effectively assured by an additional circuit including a first transistor.

While various types of the optical control circuit of the kind referred to have been suggested, an optical control circuit for turning on and off, for example, a field effect transistor (which shall be simply referred to as "FET" hereinafter) has been disclosed in U.S. Pat. No. 4,500,801 to William J. Janutka, in which a diode is connected as a constant voltage element between a control electrode and a source of a first FET, a resistor connectable in parallel with photovoltaic elements is connected between the control electrode and a drain of the first FET, and a second transistor is connected at its control electrode to the source of the first FET. In this case, a voltage applied to the control electrode of the second FET with respect to the source of the second FET to drive the first FET into a conducting state, and the second FET is to be thereby turned off.

In this patent to Janutka, the first FET has been difficult to be formed in the same substrate as that of the second FET without giving any influence on inherent characteristics of the second FET or adding complicated fabrication process steps, and there has been left a problem unsolved in that the known circuit has been difficult to be prepared in an integrated manner, so as to remain high in manufacturing costs and poor in the productivity.

TECHNICAL FIELD

A primary object of the present invention is, therefore, to provide an optical control circuit having first and second transistors which can be formed in or on a common substrate to solve the foregoing problem, as well as a semiconductor device capable of realizing such circuit.

According to the present invention, this object can be attained by means of an optical control circuit wherein a first resistive element is connected between a control electrode and a first output electrode of a first transistor, the first output electrode forming an emitter or source of the first transistor while its collector or drain being a second output electrode, a second resistive element is connected between the control electrode and the second output electrode, an array of photovoltaic elements is connected in parallel with the second resistive element, and a second transistor is connected to the first transistor for being turned off when the first transistor is in conductive state, the circuit being featured in that the second transistor is connected at a control electrode to said second output electrode forming the collector or drain of the first transistor.

Other objects and advantages of the present invention shall be made clear in following description of the invention detailed with reference to preferred embodiments of the invention shown in accompanying drawings.

While the present invention shall now be explained with reference to the embodiments shown in the accompanying drawings, it should be appreciated that the intention is not to limit the invention only to those shown in the drawings but rather to include all alterations, modifications and equivalent arrangements possible within the scope of appended claims.

DISCLOSURE OF PREFERRED EMBODIMENTS

Figure 1:
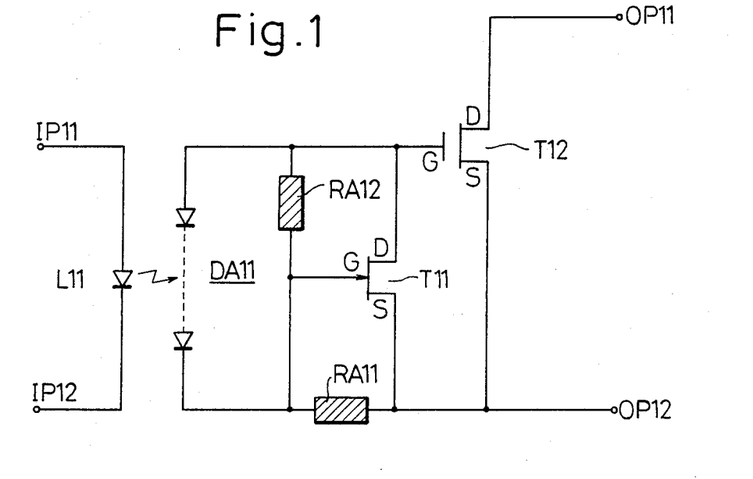
FIG. 1 is a circuit diagram showing an embodiment of the optical control circuit according to the present invention.

Referring to FIG. 1, there is shown an optical control circuit 10 according to the present invention, which includes such first transistor T11 as a thin film transistor. When an FET is employed as the first transistor T11, in the present case, a voltage applied to a gate G forming a control electrode of FET is controlled so that a current flowing between a source S as a first output electrode and a drain D forming a second output electrode can be thereby controlled. When a bipolar transistor is employed as the first transistor T11, a control of a current received at a base B as the control electrode eventually causes a current flowing between an emitter as the first output electrode and a collector as the second output electrode to be controlled.

A first resistive element RA11 is connected between the gate G and the source (or emitter) of the first transistor T11, and, preferably, a rectifying element is employed as the first resistive element. A second resistive element RA12 is connected between the gate G and the drain (or collector) D of the first transistor T11. An array of photovoltaic elements DA11 is connected in parallel with the second resistive element RA12 while this photovoltaic element array DA11 is optically coupled to a light emitting means L11 which is provided to receive a driving input through input means IP11 and IP12. The drain (or collector) D of the first transistor T11, that is, the second output electrode of the transistor is connected to a gate G forming a control electrode of a second transistor T12 a source (or emitter) S of which is connected to the source (or emitter) of the first transistor T11, and two output electrodes D and S of the second transistor T12 are connected to output terminals OP11 and OP12 for the entire optical control circuit 10. The first and second transistors T11 and T12 may be of the same conductivity type of a higher withstand voltage and a quick operation.

In the optical control circuit 10 of FIG. 1, an actuation of the light emitting means L11 with an input signal thereto causes an emitted light to be incident upon the photovoltaic element array DA11 and a photovoltaic voltage is generated across both ends of the photovoltaic element array DA11. This voltage is applied between the gate G and the source S of the second transistor T12, and an ON state is achieved across the drain and source of the second transistor T12. In the first resistive element RA11, at this time, a current flows therethrough, from right side to left side in the drawing, whereby the right side of the first resistive element RA11 is made to be at a higher potential than the left side. Accordingly, the source S as the first output electrode of the transistor T11 connected to the right side of the first resistive element RA11 is made to be at a potential higher than the gate G so as to be in a so called reverse biasing state, whereby a high resistive state or interruptive state is achieved between the first and second output electrodes, that is, the source S and the drain D of the first transistor T11. In the present instance, the second resistive element RA12 is provided with a higher resistance value than that of the first resistive element RA11, so that only a slight amount of the photovoltaic current can pass through left side path of the first resistive element, whereby the photovoltaic current generated at the photovoltaic element array DA11 can be provided quickly and at a high efficiency to the second transistor T12 without being discharged between the source S and the drain D of the first transistor T11, RA12, to bias the transistor T12 and to turn it on.

When the input to the light emitting means L11 is interrupted, on the other hand, the light input to the photovoltaic element array DA11 is interrupted and the photovoltaic power generation is stopped. In the first resistive element RA11 at this time, the current flows from the left side to the right side in the drawing, and the left side of the first resistive element RA11 will be at a higher potential than the right side. Accordingly, the gate G of the first transistor TR11 connected to the left side of the first resistive element RA11 is made at a high potential than the source S connected to the right side of the first resistive element RA11 to be in a forward biasing state. When a potential difference in the normal biasing exceeds a gate threshold level of the first transistor T11 (in the case of FET) or base-emitter voltage threshold level (in the case of bipolar transistor), a low resistive state is achieved between the source S and the drain D of the first transistor T11, and a relatively large current can be made to flow. Here, a residual accumulative charge in the capacity between the gate G and the source S of the second transistor T12 is quickly discharged through a path of the drain D and source S of the first transistor T11, the second transistor T12 is made to be of a high resistive state or interruptive state, and the second transistor T12 is made to be turned off. Any noise voltage being applied to the gate G of the second transistor T12 is also discharged through a by-passing passage of the drain and source of the first transistor T11.

In the foregoing arrangement, it is preferable to use a rectifying element as the first resistive element RA11 for a following reason. That is, it is preferable that, upon feeding a power to the second transistor T12, the current is more easily flowable from the right side to the left side in the first resistive element RA11. It is desirable, therefore, that a resistance value r2 of the second resistive element RA12 which should preferably cause the current upon the foregoing power supply to be difficult to flow therethrough and a resistance value r1a of the first resistive element RA11 upon the power supply will satisfy a relationship $r1a < r2$. At the time of the interruptive state of the second transistor T12, contrarily, it is necessary that a first discharge current is caused to flow through both the second resistive element RA12 and first resistive element RA11, and that a potential difference is generated for rendering the gate G of the first transistor T11 to be in the forward biasing state on both sides in the drawing. Due to this, it is desired that a resistance value r2 of the second resistive element RA12 and a resistance value r1b of the first resistive element RA11 upon the discharge will satisfy a relationship $r1b > r2$.

Generalizing the respective conditions for both of the power supplying and interruptive states of the second transistor T12 as has been described, there is arranged a formula $r1a < r2 < r1b$. In order to have this formula satisfied, a rectifying element having a forward direction as well as an inverse direction is employed as the first resistive element RA11. For such rectifying element, there may be utilized various types of the element, while a diode so connected that, for example, an anode of the diode is connected to the source of the first transistor T11 can be utilized.

According to another feature of the present invention, at least two or more types of the respective elements forming the optical controlling circuit are prepared on the same substrate with the same semiconductive material employed, whereby the two or more types of the constituent elements can be formed on the same substrate through the same manufacturing step, so that manufacturing efficiency can be remarkably improved. It is preferable in this case that the respective elements are formed by means of a lamination of thin films, while not intended to be particularly limited thereto.

Figure 2:
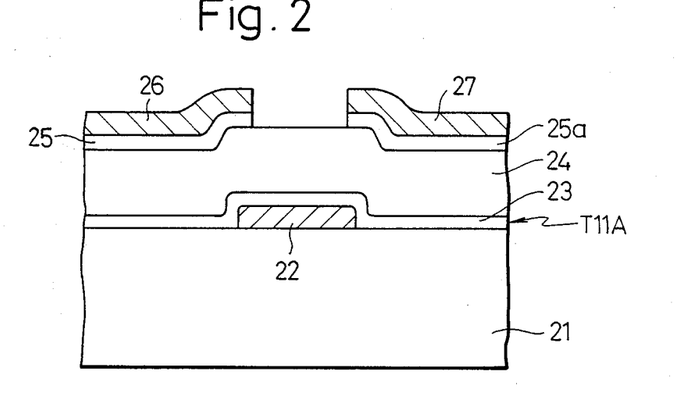
FIGS. 2 to 4 are fragmentary sectioned views of a thin film transistor forming the first transistor shown in different working aspects thereof.

Referring to FIG. 2, there is shown a structure of the first transistor T11A employed as one of the constituent elements of the foregoing optical control circuit, in which a control electrode 22 is formed on a substrate 21, such thin films as a first conduction type (e.g., P-type) semiconductor layer 23 expanding over the surface of the control electrode 22, a semiconductor layer 24 of a relatively low impurities to form a channel zone, and a pair of second conduction type (e.g., N-type) semiconductor layers 25 and 25a separate with respect to the control electrode 22 are sequentially stacked on the substrate 21 forming the control electrode 22 and, further, a source electrode 26 and drain electrode 27 are formed as engaged respectively to the second conduction type semiconductor layers 25 and 25a. In this first transistor T11A, the arrangement is so made as to render the current value flowing through the semiconductor layer 24 forming the channel zone to be controllable in response to a voltage applied to the control electrode 22.

Figure 3:
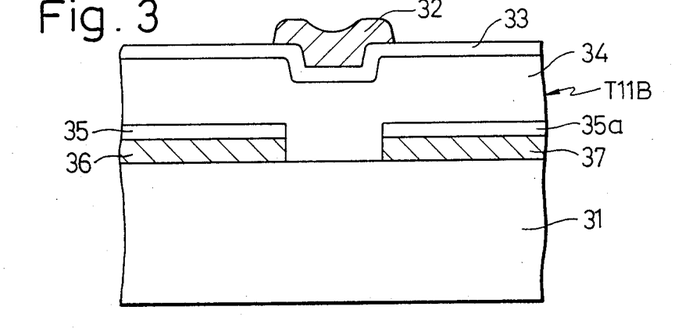

As shown in another embodiment of FIG. 3, further, it is also possible to form a first transistor T11B on a substrate 31 with a pair of separate source electrode 36 and drain electrode 37, a pair of separate semiconductor layers 35 and 35a of a second conduction type, a channel zone semiconductor layer 34, a first conduction type semiconductor layer 33, and a control electrode 32, respectively stacked sequentially on each other.

Figure 4:
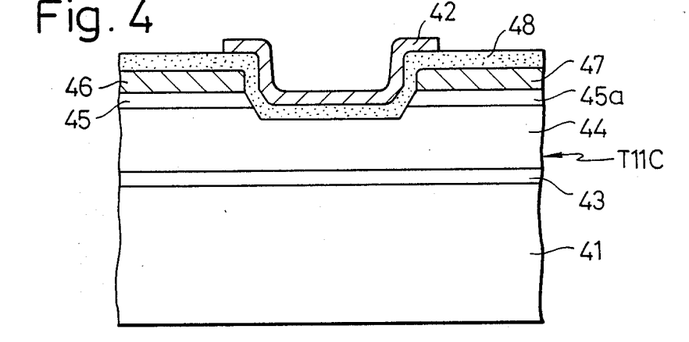

Referring to FIG. 4, an insulation gate type structure employable as the first transistor to be used as an element of the foregoing optical control circuit is shown. In this insulating gate type transistor T11C, a semiconductor layer 43 of a first conduction type (e.g., P-type), a semiconductor layer 44 forming a channel zone, a pair of separate semiconductor layers 45 and 45a of a second conduction type (e.g., N-type) and source and drain electrodes 46 and 47 are sequentially laminated on a substrate 41, an insulating layer 48 is formed to cover the semiconductor layer 44 of relatively low impurities from the source electrode 46 to the drain electrode 47, and a control electrode 42 is formed on the insulating layer 48 across the both of the source and drain electrodes 46 and 47. In this first transistor T11C, it is made possible to control the current flowing through the semiconductor layer 44 by a voltage applied to the control electrode 42.

Figure 5:
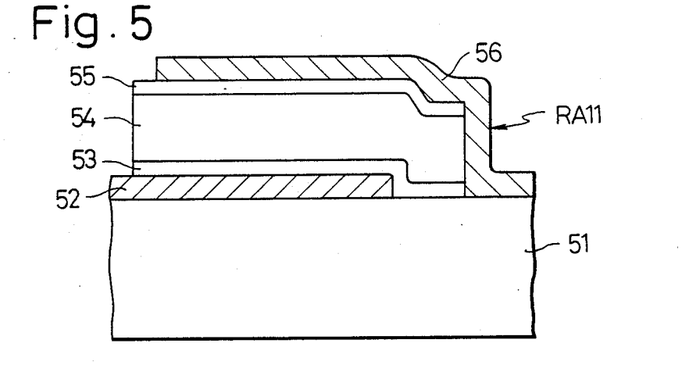
FIG. 5 is a fragmentary sectioned view of a first resistive element in a working aspect thereof, the element being employed in the circuit of FIG. 1.

Referring next to FIG. 5, there is shown a structure of the first resistive element RA11 employed as one of constituent elements of the foregoing optical control circuit. This first resistive element RA11 is prepared by forming conductive film 52 made of Ni-Cr or transparent conducting material or the like on a surface of a substrate 51, sequentially laminating a first conduction type (e.g., P-type) semiconductor layer 53, a semiconductor layer 54 of relatively low impurities and a second conduction type (e.g., N-type) semiconductor layer 55 on this conductive film 52, and laminating thereover a conductive film 56 of such a material as Al or the like which can shield light. Thus, the formed first resistive element RA11 is made to have a PIN diode structure so as to rectify the current flowing to the first resistive element. In this case, the conductive film 52 will be the anode side while the other conductive film 56 will be the cathode side. The conductive film 56, the topmost layer in the drawing, is used of the light shielding material so as to prevent the first resistive element RA11 from acting any malfunction when any leakage of light irradiated onto the photovoltaic element array DA11 irradiate the first resistive element RA11 and such light shielding film is effective specifically when the element is formed on the same substrate as that on which the photovoltaic element array DA11 is formed, whereas the topmost conducting film 56 may not be required to be light shielding type when the light leakage is insignificant or does not matter.

Figure 6:
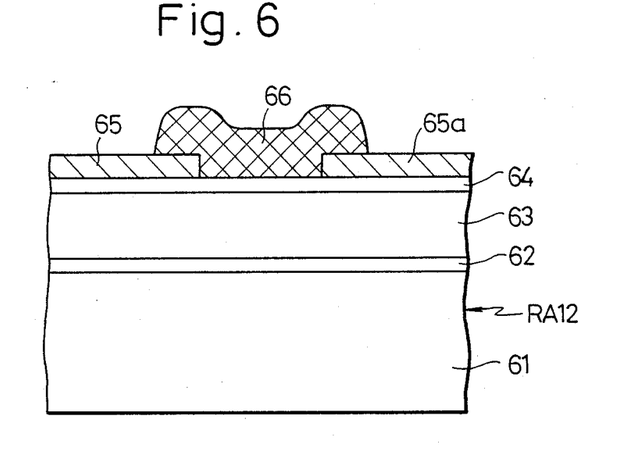
FIG. 6 shows also in a fragmentary sectioned view a working aspect of a second resistive element employed in the circuit of FIG. 1.

In FIG. 6, there is shown a structure of the second resistive element RA12 employed as another element in the foregoing optical control circuit, and this resistive element RA12 is formed by laminating on a substrate 61 sequentially respective films of a first conduction type (e.g., P-type) semiconductor layer 62, a semiconductor layer 63 of relative low impurities and a second conduction type (e.g., N-type) semiconductor layer 64, further laminating on the layer 64 a pair of mutually separated conductive films 65 and 65a, and providing a light-shielding layer 66 made of a light-shielding and electrically insulated material so as to fill in a space between conductive film 65 and 65a and cover the semiconductor layer 64. In this case, too, the light-shielding layer 66 may be made unnecessary when no risk of light irradiation upon the second resistive element RA12 arises. While in the aspect shown in FIG. 6 the conductive films 65 and 65a are to be formed as the topmost layer, they may be formed between the substrate 61 and the first conduction type semiconductor layer 62, similarly to the case of FIG. 2 or 5.

Figure 7:
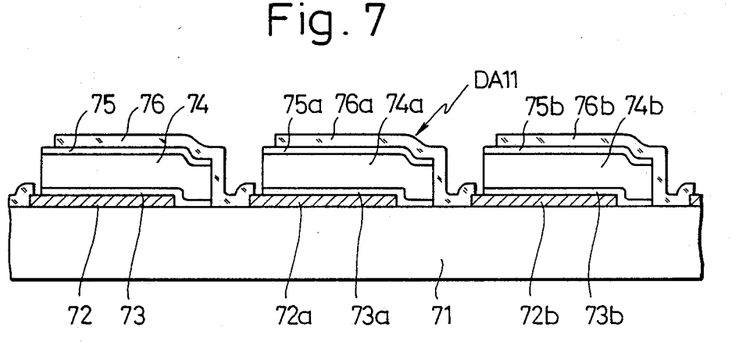
FIG. 7 shows also in a fragmentary sectioned view an array of photovoltaic elements employed in the circuit of FIG. 1.

Referring next to FIG. 7, there is shown a structure of the photovoltaic element array DA11 employed as still another element of the foregoing optical control circuit, in which only three of the photovoltaic elements are illustrated. The photovoltaic element array DA11 is formed by laminating sequentially on a common substrate 71 mutually separated conducting films 72, 72a, 72b . . . of Ni-Cr or transparent conductive material or the like, first conduction type (e.g., P-type) semiconductor layers 73, 73a and 73b respectively on each of the films 72, 72a and 72b, semiconductor layers of relatively low impurities 74, 74a and 74b respectively on each of the layers 73, 73a and 73b, and second conduction type (e.g., N-type) semiconductor layers 75, 75a and 75b respectively on each of the layers 74, 74a and 74b, and covering the respective laminated layers with each of conducting films 75, 76a and 76b of such a transparent conductive material as $In_2O_3$ or the like.

According to the foregoing lamination structures, it will be seen that, for example, the first transistor T11 of FIG. 2, first resistive element RA11 of FIG. 5 and photovoltaic element array DA11 of FIG. 6, have same lamination structures respectively from the conducting films 22, 52, 72, 72a and 72b to the second conduction type semiconductor layers 25, 25a, 55, 75, 75a and 75b, the first transistor T11 of FIG. 2 and in the first resistive element RA11 of FIG. 5 up to the topmost conducting films 26, 27 and 56, the lamination structure is same also in the second resistive element RA12 of FIG. 6, and the lamination structure is same as such three elements as above from the first conductive type semiconductor layer 62 to the topmost conductive films 65 and 65a except for a conductive film on the substrate. Further, the first transistor T11C of FIG. 4 may also be same as the above elements in the lamination structure from the first conduction type semiconductor layer 43 to the second conduction type semiconductor layers 46 and 47. While the first transistor T11B of FIG. 3 is of an opposite lamination structure to the above elements, the one employed in the above elements are reversible, and they can be formed in the same lamination structure of the first transistor T11B.

Accordingly, it should be appreciated that the respective elements in the above can be formed on a common substrate through the minimum manufacturing steps with the minimum required number of parts.

Figure 8:
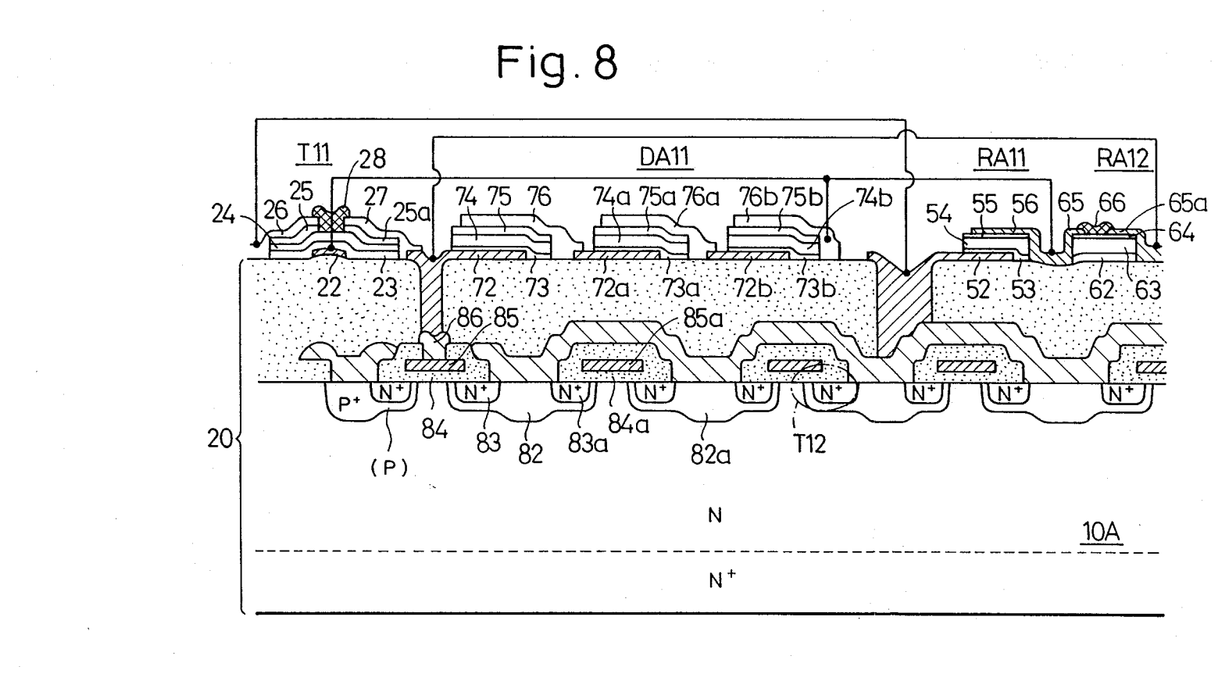
FIG. 8 is a fragmentary sectioned view of a semiconductor device in an embodiment in which the optical control circuit according to the present invention is employed as a light receiving section.

Referring now to FIG. 8, there is shown an embodiment of a semiconductor device 10A which has realized the entirety of the optical control circuit 10, in which the foregoing first transistor T11, first resistive element RA11, second resistive element RA12, photovoltaic element array DA11 and additionally second transistor T12 are all integrated, while this embodiment except for second transistor T12 is provided as a light receiving section of a switching device. In the present instance, the respective elements are concurrently provided substantially on the insulating layer shown as dotted in a substrate 20.

Referring more specifically to the device 10A, a required number for the array of the photovoltaic elements DA11 is formed on the insulating layer of the substrate 20, that is the conductive thin films 72, 72a, 72b . . . preferably of Ni-Cr or transparent conducting material or the like are laminated sequentially thereon, first conduction type (e.g., P-type) semiconductor layers 73, 73a, 73b . . . preferably of an amorphous silicon or the like to be laminated on the films 72, 72a, 72b . . . and partly with the upper insulating layer, low-impurity semiconductor layers 74, 74a, 74b . . . on the layers 73, 73a, 73b . . . second conduction type (e.g., N-type) semiconductor layers 75, 75a, 75b . . . on the layers 74, 74a, 74b . . . and transparent conductive films 76, 76a, 76b . . . preferably of $In_2O_3$ or the like on the layers 75, 75a, 75b . . . , so that substantially PIN type elements will be formed. In this case, the respective photovoltaic elements are mutually connected in series to form the array DA11, by means of connecting the topmost transparent conductive films of the photovoltaic element respectively to the bottom conductive thin films of the next one.

Further, in preparing the photovoltaic element array DA11, it is possible to form the first transistor T11 concurrently such as on the control electrode 22, first conduction type semiconductor layer 23, low-impurity semiconductor layer 24, second conduction type semiconductor layers 25, 25a and source and drain electrodes 26, 27 are laminated sequentially as well as the first transistor T11, the first and second resistive elements RA11, RA12 can be formed concurrently such as the conductive film 52, first conduction type semiconductor layers 53, 62, low-impurity semiconductor layers 54, 63, second conductive type semiconductor layers 55 and 64, conductive film 56 and 65 provided across the both elements DA11 and DA12, and further conductive film 65a are laminated sequentially with the same material through the same manufacturing steps. In this case, the last staged transparent conductive film (76b in the drawing) of the photovoltaic element array DA11 is connected to the electrode 52 of the first resistive element RA11, the light-shielding films 28 and 66 are provided at the top of the first transistor T11 and second resistive element RA12, and the respective electrodes are connected with one another on the basis of a desired circuit design or specification as shown, just as an example, by solid lines in the drawing.

A lower part of the substrate 20 comprises a low resistivity body (N+) and a high resistivity region (N) both of the second conduction type, as well as a plurality of mutually separated P region 82, 82a . . . of the first conduction type impurity formed in the surface of the high resistivity region (N). In the respective P region 82, 82a . . . , a pair of N+ region 83 and 83a of second conduction type impurity, which region 83 and 83a are connected to each other while not shown in FIG. 8. On the substrate formed impurity regions, a plurality of insulating layers 84, 84a . . . are formed so that each of the layers 84, 84a . . . will ride across adjacent two of the P regions 82, 82a . . . to cover concurrently ones of the N+ layers 83 and 83a in the adjacent P layers, while an electrode 85 of Poly Si or the like is formed on each of the insulating films 84, 84a . . . , thereon insulating layers are formed and a common conducting film 86 of Al or the like are enclosed whereby a plurality of double diffusion type second transistors T12 as denoted by a chain-line circle are formed, with the electrode 85 made as an insulating gate, N+ region 83, 83a . . . as a source, N-type high resistivity region around the P regions 82, 82a . . . as a drain, and parts of the P regions 82, 82a . . . held between the N+ region 83, 83a . . . and the high resistivity region (N) as a channel. In these double diffusion type second transistors T12, the channel length is defined by the thickness of the P regions 82, 82a . . . held between the N-type high resistivity region (N) and the N+ region 83, 83a . . . , that is, by a diffusion state of the P regions 82, 82a . . . and N+ region 83, 83a . . . into the high resistivity region, so that the channel length can be made shorter without requiring such technique as a photolithography or the like, so as to allow a high withstanding voltage to be obtained and high speed operating characteristics realized. In the present instance, the high resistance zone is to be the drain of the respective second transistors T12 so that they can be mutually electrically connected in parallel.

Further, the conductive thin film 72 in the first staged photovoltaic element in the array DA11 is connected to the drain electrode 27 of the first transistor T11 and, through the conducting thin film 86, to the gate electrode of the second transistors T12, while the conducting layer 52 of the first resistive element RA11 on the other side of the array DA11 is connected to the source of the second transistors T12, and the semiconductor device 10A corresponding to the optical control circuit 10 shown in FIG. 1 can be thereby provided.

Figure 9:
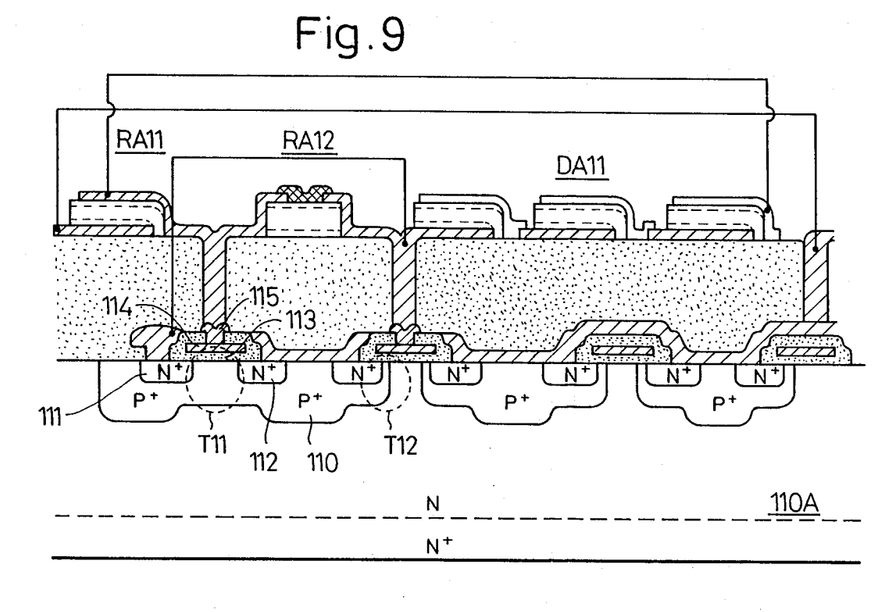
FIGS. 9 and 10 are fragmentary sectioned views showing structures in other embodiments of the semiconductor device according to the present invention.

Referring next to FIG. 9 showing a semiconductor device 110A in another embodiment of the present invention, the first transistor T11 in this device 110A is formed simultaneously with the second transistor T12 in a common substrate, as denoted by dotted-line circles. In the present instance, the second transistor T12 is formed substantially in the same manner as that in the device 10A shown in FIG. 8, while the first transistor T11 is so provided that a second conduction type (e.g., N+ -type) semiconductor region 111 forming a drain and also a second conduction type semiconductor layer 112 forming a source are formed as mutually separated in a first conduction type (e.g., P-type) semiconductor region 110 which is formed when the second transistor T12 is formed. An insulating layer 113 is formed on and across these semiconductor regions 111 and 112, and a gate electrode 114 is formed by Poly Si or the like material on this insulating layer 113. The respective source, drain and gate of the first transistor T11 are connected, as shown, respectively to the source and drain of the second transistor T12, and the first and second resistive elements RA11 and RA12. Similarly to the case of the device 10A shown in FIG. 8, the first and second resistive elements RA11 and RA12 as well as the photovoltaic element array DA11 are formed in the same thin film formation as in the case of the device 10A shown in FIG. 8. Here, the threshold value of the first transistor T11 is controlled to be lower than that of the second transistor T12 by means of an ion injection or the like performed between the source and drain.

With this device, the turning-off operation of the second transistor T12 upon interruption of the light input to the photovoltaic element array DA11 can be speeded up. That is, provided that the threshold voltage of the first transistor T11 is higher than that of the second transistor T12, the first transistor T11 comes into the turn-off state before the second transistor 12 is turned off while the accumulated charge at the gate of the second transistor 12 is being discharged. Thereafter, this discharging is executed through the first and second resistive elements RA11 and RA12, so that turning off the second transistor T12 will require a relatively long time. When, on the other hand, the first transistor T11 has a lower threshold voltage than the second transistor T12, such state as above does not arise so that the gate charge can be quickly discharged to realize the high speed turning-off.

Figure 10:
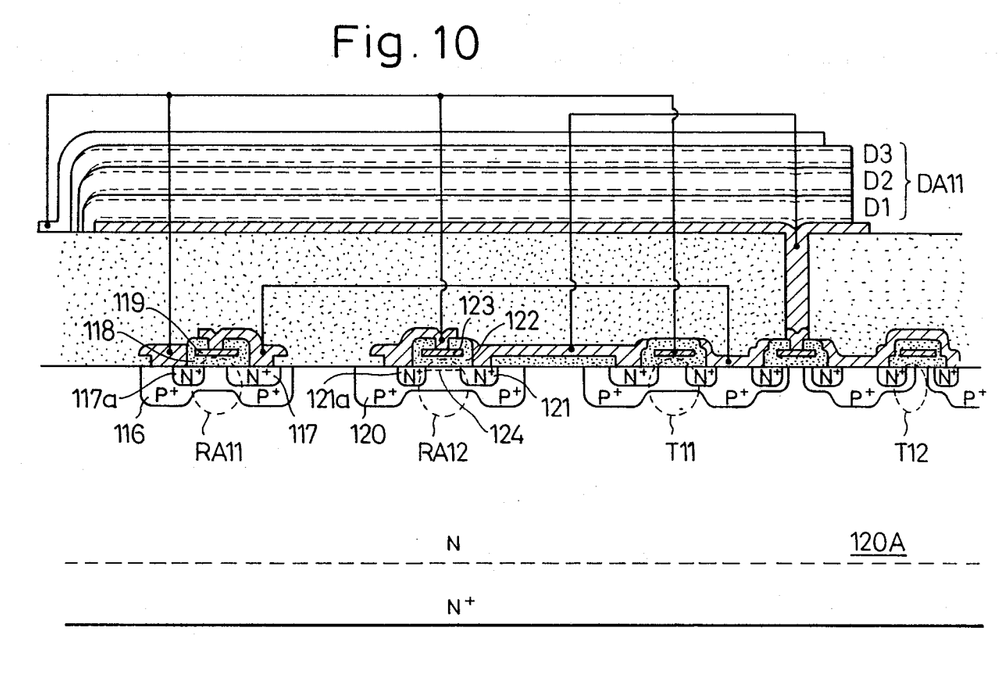
Figure 11:
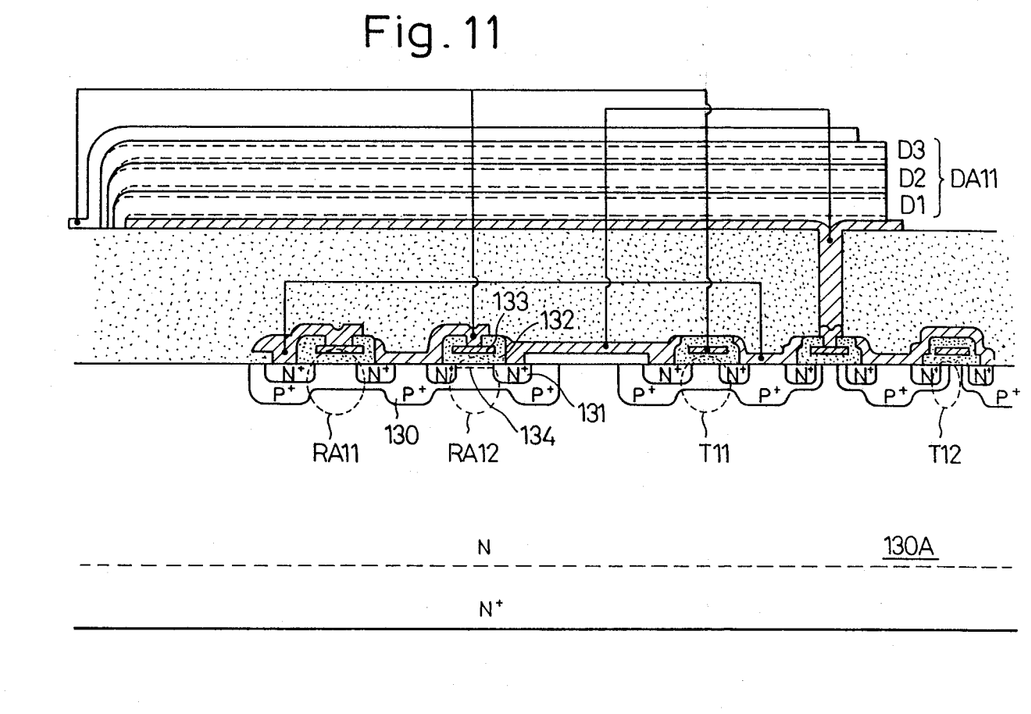
FIG. 11 is a circuit diagram of the device shown in FIG. 10.
Figure 12:
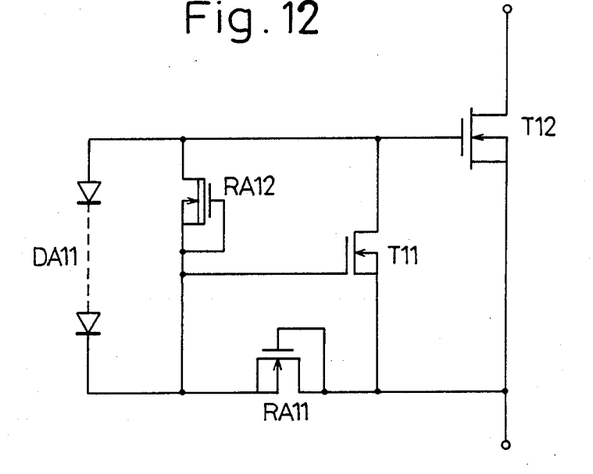

In FIGS. 10, 11 and 12, there is shown still another embodiment of the semiconductor devices 120A, 130A according to the present invention, in which an insulating gate type transistor is employed for the first and second transistors T11 and T12. In the present invention, further, the same insulating type transistor as that of the first transistor T11 is employed also for the first resistive element RA11, while the drain and gate in this element are mutually connected, the drain electrode is connected to the source electrode of the first transistor T11 and the source electrode is also connected to the gate electrode of the first transistor T11. As will be clear in view of circuit diagram of FIG. 12, the second resistive element RA12 is a constant current type resistive element, and can be realized by employing a depression type transistor made by forming a thin conducting layer by means of an ion injection or the like between a source and a drain in the insulating gate type transistor of the same structure as the first transistor T11, and connecting mutually the source electrode and the gate electrode of this depression type transistor. Further, this transistor is connected at the source electrode to the gate electrode of the first transistor T11 and at the drain electrode to the gate of the second transistor T12, respectively.

More specifically, as will be clear in view of FIG. 10, the first resistive element RA11 of the same structure as the first transistor T11 is formed to have a pair of second conduction type (e.g., $N^+$-type) semiconductor regions 117 and 117a formed in a first conduction type (e.g., P-type) semiconductor region 116, as mutually separated. An insulating layer 118 is formed on and across these semiconductor regions 117 and 117a, and an electrode 119 of Poly Si or the like material is formed on the insulating layer 118. The second resistive element RA12 will be substantially of the same structure as the first resistive element RA11, but the second resistive element RA12 is provided with a thin and second conduction type semiconductor layer 124 made to be positioned across two mutually separated and second conduction type semiconductor regions 121 and 121a. Further, the first resistive element RA11 and the second resistive element RA12 can be formed in a common semiconductor region 130 of a first conductivity type (e.g., P-type) element shown in FIG. 11. Moreover, the photovoltaic element array DA11 in the present instance is formed as laminated on the substrate vertically, preferably in three layers, without being respectively divided as in the case of the devices 10A and 110A of FIGS. 8 and 9 embodiments.

With the foregoing structure shown in FIGS. 10 and 11, it is made possible to form concurrently on and in a common substrate as integralized the respective first and second transistors T11 and T12 and first and second resistive elements RA11 and RA12, other than the photovoltaic element array, so that the designing freedom can be increased, the manufacturing costs can be decreased and the productivity can be remarkably improved.

What we claim as our invention is:

1. An optical control circuit comprising a first transistor having a control electrode and first and second output electrodes, said first output electrode forming one of an emitter and source and said second output electrode forming one of a collector and drain,
    a first resistive element connected between said control electrode and said first output electrode of said first transistor,
    a second resistive element connected between said control electrode and said second output electrode of said first transistor,
    an array of a plurality of photovoltaic elements connected in parallel with said second resistive element, and
    a second transistor having a control electrode connected to said second output electrode of said first transistor for being turned off when the first transistor is in conductive state.

2. A circuit according to claim 1, wherein said first resistive element is a rectifying element showing asymmetric current and voltage characteristics responsive to current flowing direction in said element.

3. A semiconductor device forming said optical control circuit according to claim 1, wherein at least two of said first transistor, first and second resistive elements and photovoltaic element array are formed on a common substrate with semiconductor thin films of the same material.

4. A device according to claim 3, wherein said two formed on said common substrate are said first and second resistive elements.

5. A device according to claim 4, wherein said first and second resistive elements are formed at least partly with a common layer.

6. A device according to claim 3, wherein said two formed on said common substrate are said first transistor and said first resistive element.

7. A device according to claim 6, wherein said first transistor and first resistive element are formed at least partly with a common layer.

8. A device according to claim 3, wherein said two formed on said common substrate are said first resistive element and said photovoltaic element array.

9. A device according to claim 8, wherein said first resistive element and photovoltaic element array are formed at least partly with a common layer.

10. A device according to claim 3, wherein said two formed on said common substrate are said first transistor and said second resistive element.

11. A device according to claim 10, wherein said first transistor and second resistive element are formed at least partly with a common layer.

12. A device according to claim 3, wherein said two formed on said common substrate are said second resistive element and said photovoltaic element array.

13. A device according to claim 12, wherein said second resistive element and photovoltaic element array are formed at least partly with a common layer.

14. A device according to claim 3, wherein said two formed on said common substrate are said first transistor and said photovoltaic element array.

15. A device according to claim 14, wherein said first transistor and photovoltaic element array are formed at least partly with a common layer.

16. A device according to claim 3, wherein said first and second transistors, said first and second resistive elements and said photovoltaic element array are formed on a common substrate.

17. A device according to claim 16, wherein said first transistor, first and second resistive elements and photovoltaic element array are formed at least partly in the same structure.

18. A semiconductor device forming said optical control circuit according to claim 1, wherein said first transistor, first and second resistive elements and photovoltaic element array formed on a substrate in which said second transistor is formed.

19. A semiconductor device forming said optical control circuit according to claim 1, wherein said first and second resistive elements and photovoltaic element array formed on a substrate in which said first and second transistor are formed.

20. A device according to claim 19, wherein said first transistor is formed in one region of a first conductivity type formed in surface of a semiconductor substrate of a second conductivity type which is the drain or the collector of said second transistor.

21. A device according to claim 19, wherein said first and second transistors are at least partly of the same structure.

22. A device according to claim 19, wherein said first and second resistive elements and said photovoltaic element array are formed at least partly in the same structure.

23. A semiconductor device forming said optical control circuit according to claim 1, wherein said first resistive element and photovoltaic element array formed on a substrate in which said first and second transistor, and second resistive element are formed.

24. A device according to claim 23, wherein said first transistor and second resistive element are respectively formed in each one of regions of a first conductivity type formed in surface of a semiconductor substrate of a second conductivity type which is the drain or the collector of said second transistor.

25. A device according to claim 23, wherein said first and second transistors, and said second resistive element are at least partly of the same structure.

26. A device according to claim 23, wherein said first resistive element and said photovoltaic element array are formed at least partly in the same structure.

27. A semiconductor device forming said optical control circuit according to claim 1, wherein said second resistive element and photovoltaic element array formed on a substrate in which said first and second transistors, and first resistive element are formed.

28. A device according to claim 27, wherein said first transistor and first resistive element are respectively formed in each one of regions of a first conductivity type formed in surface of a semiconductor substrate of a second conductivity type which is the drain or the collector of said second transistor.

29. A device according to claim 27, wherein said first and second transistors, and said first resistive element are at least partly of the same structure.

30. A device according to claim 27, wherein said second resistive element and said photovoltaic element array are formed at least partly in the same structure.

31. A semiconductor device forming said optical control circuit according to claim 1, wherein said first transistor and photovoltaic element array formed on a substrate in which said first and second resistive elements, and second transistor are formed.

32. A device according to claim 31, wherein said first and second resistive elements are respectively formed in each one of regions of a first conductivity type formed in surface of a semiconductor substrate of a second conductivity type which is the drain or the collector of said second transistor.

33. A device according to claim 31, wherein said first and second resistive elements are formed in a common region of a first conductivity type formed in surface of a semiconductor substrate of a second conductivity type which is the drain or the collector of said second transistor.

34. A device according to claim 31, wherein said first and second resistive elements, and said second transistor are at least partly of the same structure.

35. A device according to claim 31, wherein said firs transistor and said photovoltaic element array are formed at least partly in the same structure.

36. A semiconductor device forming said optical control circuit according to claim 1, wherein said photovoltaic element array formed on a substrate in which said first and second transistors, and first and second resistive elements are formed.

37. A device according to claim 36, wherein said first transistor, first and second resistive elements are formed in regions of a first conductivity type formed in surface of a semiconductor substrate of a second conductivity type which is the drain or the collector of said second transistor.

38. A device according to claim 37, wherein said first and second resistive elements are formed in the common region of said regions, and said first transistor is formed in one of said regions.

39. A device according to claim 37, wherein said first transistor, first and second resistive elements are respectively formed in each one of said regions.

40. A device according to claim 36, wherein said first and second transistors and said first and second resistive elements are at least partly of the same structure.

41. A device according to claim 36, wherein said photovoltaic element are laminated in the thickness direction of said substrate.

42. A circuit according to claim 1, wherein said first and second transistors are of an insulating gate type.

43. A circuit according to claim 42, wherein said first transistor has a threshold voltage set higher than that of said second transistor.

44. A circuit according to claim 1, wherein said first resistive element comprises an insulating gate type transistor having a gate and drain which are mutually connected and a source connected to a gate of said first transistor, said drain being also connected to said source of the first transistor.

45. A circuit according to claim 1, wherein said second resistive element comprises an insulating gate type and depression type transistor having a gate and source mutually connected, said source being also connected to a gate of said first transistor, and a drain connected to a gate of said second transistor.

* * * * *